(12) United States Patent
Kim et al.

(10) Patent No.: US 8,445,996 B2
(45) Date of Patent: May 21, 2013

(54) SEMICONDUCTOR PACKAGE

(75) Inventors: Yong-hoon Kim, Suwon-si (KR);
Hee-seok Lee, Yongin-si (KR);
Yun-seok Choi, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 750 days.

(21) Appl. No.: 12/568,224

(22) Filed: Sep. 28, 2009

(65) Prior Publication Data
US 2010/0013066 A1  Jan. 21, 2010

Related U.S. Application Data

(63) Continuation-in-part of application No. 11/870,533, filed on Oct. 11, 2007, now Pat. No. 7,705,433.

(30) Foreign Application Priority Data
Oct. 6, 2008  (KR) .................. 10-2008-0097785

(51) Int. Cl.
*H01L 23/60* (2006.01)

(52) U.S. Cl.
USPC .................................. 257/659; 257/E23.114

(58) Field of Classification Search
USPC ... 257/659, 660, 777, 778, E23.114; 361/818
See application file for complete search history.

(56) References Cited

U.S. PATENT DOCUMENTS

| 2006/0003494 A1* | 1/2006 | Li ................................... 438/124 |
| 2007/0181991 A1* | 8/2007 | Ishino et al. .................. 257/686 |
| 2007/0194427 A1* | 8/2007 | Choi et al. ..................... 257/686 |
| 2007/0236393 A1* | 10/2007 | Anzai ..................... 343/700 MS |

FOREIGN PATENT DOCUMENTS

| JP | 2002-314028 | 10/2002 |
| JP | 2003-078023 | 3/2003 |
| KR | 100714310 B1 | 4/2007 |

* cited by examiner

*Primary Examiner* — Calvin Lee
*Assistant Examiner* — Scott Stowe
(74) *Attorney, Agent, or Firm* — F. Chau & Associates, LLC

(57) ABSTRACT

A semiconductor package includes a main substrate, a semiconductor chip having a first side and a second side, the first side of the semiconductor chip disposed on the main substrate and electrically connected to the main substrate, and a conductive network formed on the second side of the semiconductor chip.

13 Claims, 7 Drawing Sheets

US 8,445,996 B2

SEMICONDUCTOR PACKAGE

CROSS-REFERENCE TO RELATED APPLICATIONS

This application is a continuation-in-part application of U.S. application Ser. No. 11/870,533, filed Oct. 11, 2007 now U.S. Pat. No. 7,705,433, and claims priority under 35 U.S.C. §119 to Korean Patent Application 10-2008-0097785 filed on Oct. 6, 2008, the contents of both are incorporated by reference herein in their entirety.

BACKGROUND

1. Technical Field

The present disclosure relates to a semiconductor package, and more particularly, to a semiconductor package including an antenna.

2. Discussion of Related Art

A portable electronic device includes a semiconductor package. The semiconductor package may include an antenna for performing wireless communication between semiconductor packages. Electro static can damage the semiconductor package having the antenna.

SUMMARY OF THE INVENTION

According to an exemplary embodiment of the present invention, a semiconductor package comprises a main substrate, a semiconductor chip having a first side and a second side, the first side of the semiconductor chip disposed on the main substrate and electrically connected to the main substrate, and a conductive network formed on the second side of the semiconductor chip.

The semiconductor package can be a flip-chip package.

The semiconductor package may further comprise at least one conductive plug disposed in the semiconductor chip and electrically connecting the conductive network to the main substrate.

The semiconductor package may further comprise at least one conductive wire electrically connecting the conductive network to the main substrate.

The semiconductor package may further comprise at least one conductive plug which penetrates the semiconductor chip and electrically connects the conductive network to the main substrate, and at least one conductive wire electrically connecting the conductive network to the main substrate.

The semiconductor package may further comprise a connection member electrically connecting the main substrate to the semiconductor chip.

The conductive network may include a conductive plane or conductive lines that cover at least a part of the second side of the semiconductor chip.

The conductive network can be formed of redistributed metal wires.

The semiconductor package may further comprise at least one conductive bar attached to the conductive network.

The at least one conductive bar can be attached to the conductive network in a direction perpendicular to the conductive network.

According to an exemplary embodiment of the present invention, a semiconductor package comprises a main substrate, a semiconductor chip having a first side and a second side, the first side of the semiconductor chip disposed on the main substrate and electrically connected to the main substrate, and a conductive network formed on the second side of the semiconductor chip, wherein the conductive network includes a first part and second part separated from the first part.

The semiconductor package may further comprise a conductive bar disposed on the first part of the conductive network.

The semiconductor package may further comprise a conductive member disposed between the first side of the semiconductor chip and the main substrate.

The semiconductor package may flintier comprise at least one conductive plug disposed in the semiconductor chip and electrically connecting the conductive network to the main substrate.

According to an exemplary embodiment of the present invention, a semiconductor chip comprises a first side having a conductive network thereon, and a second side formed opposite to the first side, the second side having a conductive pad thereon, wherein the conductive network and the conductive pad is electrically connected with each other through a conductive plug disposed in the semiconductor chip.

BRIEF DESCRIPTION OF THE DRAWINGS

Exemplary embodiments of the present invention will be more clearly understood from the following detailed description, taken in conjunction with the accompanying drawings in which.

DETAILED DESCRIPTION OF EXEMPLARY EMBODIMENTS

The invention is described more fully hereinafter with reference to the accompanying drawings, in which exemplary embodiments of the invention are shown. This invention may, however, be embodied in many different forms and should not be construed as limited to the embodiments set forth herein.

It will be understood that when an element is referred to as being "on" another element, it can be directly on the other element or intervening elements may be present there between.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 1:
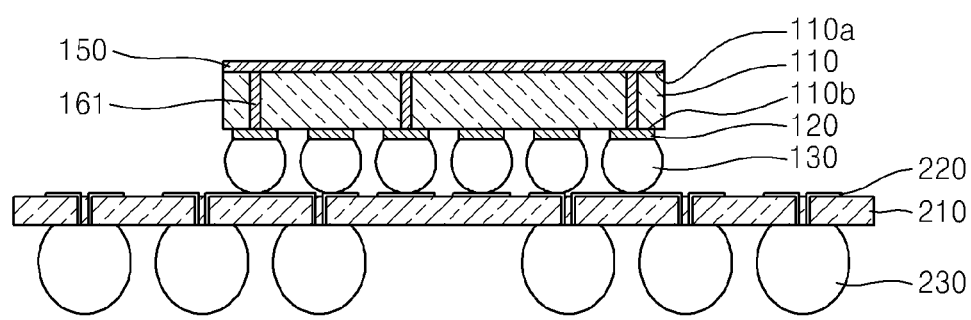
FIG. 1 is a cross-sectional view of a semiconductor package according to an exemplary embodiment of the present invention.

FIG. 1 is a cross-sectional view of a semiconductor package according to an exemplary embodiment of the present invention.

Referring to FIG. 1, the semiconductor package includes a main substrate 210 and a semiconductor chip 110 that is disposed on the main substrate 210. The semiconductor chip 110 includes a semiconductor device to be electrically connected to the main substrate 210.

The semiconductor chip 110 may include a structure in which the semiconductor device is formed on a semiconductor substrate that may be a silicon substrate. In an exemplary embodiment, the semiconductor substrate may be a silicon on insulator (SOI) substrate.

According to an exemplary embodiment, the semiconductor device is formed on a front side 110b of the semiconductor chip 110. Thus, the semiconductor substrate is exposed on a back side 110a of the semiconductor chip 110.

The front side 110b of the semiconductor chip 110 may be disposed toward the main substrate 210. That is, the front side 110b of the semiconductor chip 110 faces the main substrate 210. Therefore, the back side 110a of the semiconductor chip 110 may be disposed to be apart from the main substrate 210.

In an exemplary embodiment, a conductive network 150 is formed on the back side 110a of the semiconductor chip 110. The conductive network 150 may be formed of metal wires that are redistributed on the back side 110a of the semiconductor chip 110. The conductive network 150 may include a conductive plane or conductive lines that cover at least a part of the back side 110a of the semiconductor chip 110.

The conductive network 150 may be an antenna in the semiconductor package. The conductive network 150 may form a static electricity discharging portion for discharging static electricity out of the semiconductor package. In an exemplary embodiment, the conductive network 150 may form the antenna and the static electricity discharging portion at the same time.

The semiconductor package may further include at least one conductive plug 161 that is connected to the conductive network 150, and penetrates through the semiconductor chip 110. For example, when the semiconductor chip 110 is formed using the silicon substrate, the conductive plug 161 may be formed using a through via silicon (TSV) process. The conductive plug 161 may be connected to a first conductive pad 120 that is formed on the front side 110b of the semiconductor chip 110.

Connection members 130 that electrically connect the main substrate 210 to the semiconductor chip 110 may be disposed between the main substrate 210 and the semiconductor chip 110. In an exemplary embodiment, a connection member 130 may be disposed between the first conductive pad 120 that is formed on the front side 110b of the semiconductor chip 110 and the second conductive pad 220 that is formed on the main substrate 210. In an exemplary embodiment, the semiconductor chip 110 is mechanically supported on the main substrate 210 by the connection members 130.

The connection members 130 may be conductive bumps and/or solder balls. In an exemplary embodiment, the semiconductor chip 110 may be directly connected to the second conductive pad 220 of the main substrate 210 without the connection members 130.

An external connection terminal 230 that may be electrically connected to the outside may be further formed under the main substrate 210.

The semiconductor package according to an exemplary embodiment may form a flip-chip package. Semiconductor packages may be classified into wire bonding packages and flip-chip bonding packages according to the connection of the semiconductor chips. In the wire bonding packages, a conductive pad of a semiconductor chip and a main substrate (for example, a lead frame) are connected to each other using conductive wires. In the flip-chip bonding packages, the semiconductor chip and the main substrate are connected to each other using a conductive bump and/or a solder ball disposed on the conductive pad of the semiconductor chip or the semiconductor chip is directly connected to a connection terminal of the main substrate. The flip-chip bonding packages have a connection path that is shorter than that of the wire bonding packages, and thus, have excellent thermal and electrical properties and a small package size.

Figure 2:
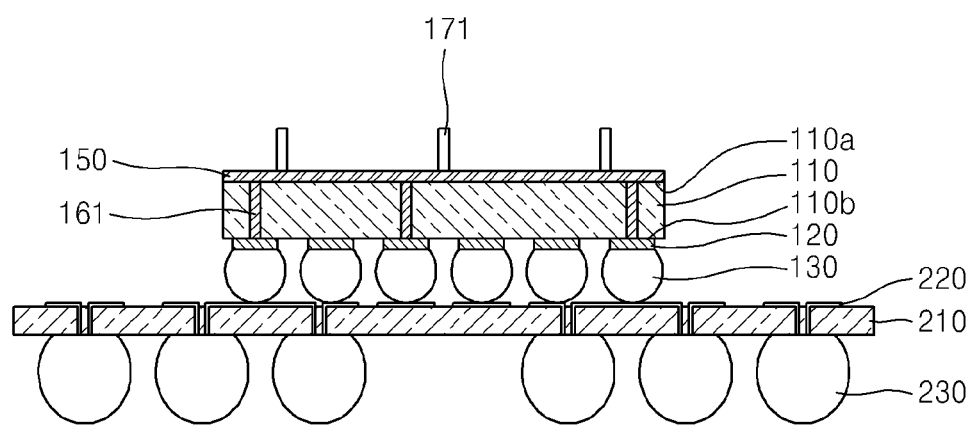
FIGS. 2 and 3 are respectively a cross-sectional view and a perspective view of a semiconductor package according to an exemplary embodiment of the present invention.
Figure 3:
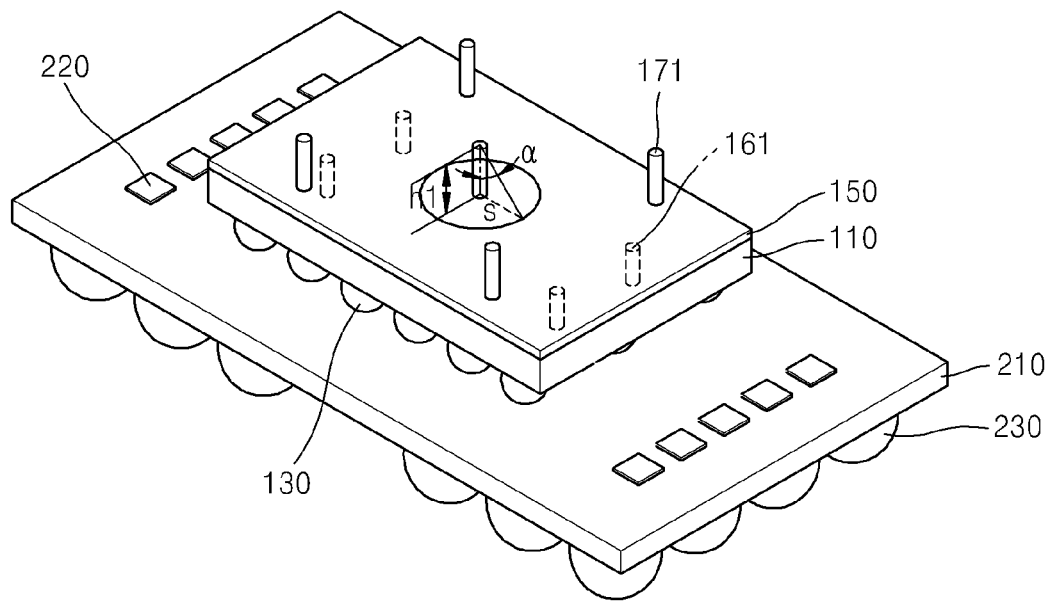

FIGS. 2 and 3 are a cross-sectional view and a perspective view of a semiconductor package respectively according to an exemplary embodiment of the present invention. The semiconductor package may further include at least one conductive bar 171 in addition to the components of the semiconductor package shown in FIG. 1.

Referring to FIGS. 2 and 3, the semiconductor package may further include at least one conductive bar 171 that is attached on the conductive network 150. The conductive bar 171 may be attached in a direction perpendicular to the conductive network 150. Diameters of the upper and lower portions of the conductive bar 171 may be equal to each other. A horizontal cross-section of the conductive bar 171 may have a curvature on at least a part, or may have a polygonal shape without having a curvature. The diameter of the conductive bar 171 may vary depending on the shape of the semiconductor package. The conductive bar 171 may be formed of a material having a high electrical conductivity, for example, at least one of gold, silver, or aluminum.

The conductive bar 171 may be attached to the conductive network 150 in various ways. For example, a wire bonding method that is generally used in the semiconductor packaging processes, or an electroplating method may be used to attach the conductive bar 171 to the conductive network 150. In an exemplary embodiment, a micro electro mechanical system (MEMS) may be used. The fabrication process of the conductive bar 171 may be determined in consideration of the size of semiconductor package or an environment in which the conductive bar 171 is fabricated.

A wire bonding method, an electric plating method, or an MEMS method may be used to attach the conductive bar 171 according to an exemplary embodiment of the present invention. For example, the conductive bar 171 may be attached to the conductive network 150 by using the wire bonding method. In an exemplary embodiment, a wire is attached to the conductive network 150, and after that, the wire is grown in the direction perpendicular to the conductive network 150. The growth of the wire is stopped at an appropriate height, thereby forming the conductive bar 171. Accordingly, the conductive bar 171 may be fabricated using a known wire bonding method, and thus the fabrication costs may be reduced.

The conductive bar 171 increases an efficiency of absorbing electromagnetic waves induced from the outside. As a first height h1 of the conductive bar 171 increases, an effective area S that absorbs the electromagnetic waves and transmits the electromagnetic waves to the conductive network 150 increases. In an exemplary embodiment, a maximum angle (α) between the effective area S and the conductive bar 171 is 45°. That is, a radius of the effective area S may be same as the first height h1 of the conductive bar 171. Therefore, the effective area S may vary depending on the first height h1 of the conductive bar 171

In an exemplary embodiment, the conductive network 150 and the conductive bar 171 may be arranged differently from FIGS. 2 and 3. That is, the shapes and arrangements of the conductive network 150 and the conductive bar 171 may be different according to the shape and usage of the semiconductor package.

Figure 4:
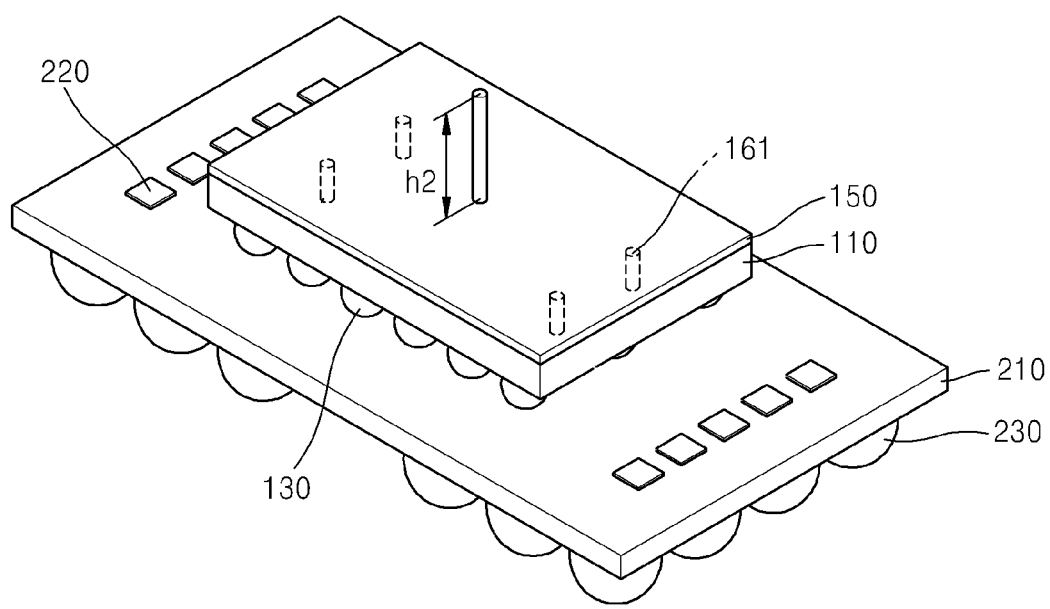
FIGS. 4 and 5 are perspective views showing semiconductor packages according to exemplary embodiments of the present invention.
Figure 5:
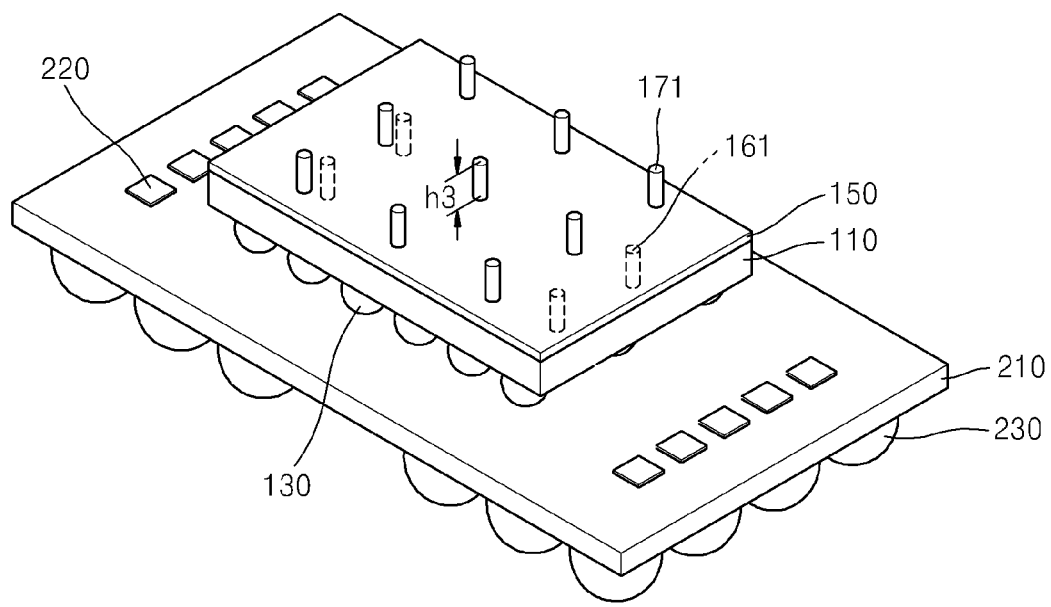

FIGS. 4 and 5 are perspective views of semiconductor packages according to exemplary embodiments of the present invention.

Referring to FIG. 4, the conductive bar 171 may have a second height h2. Since the second height h2 of the conductive bar 171 is higher than the first height h1 of the conductive bar 171 of FIG. 3 on the same conductive network 150, the effective area S is greater than that of the one shown in FIG. 3. Therefore, a central portion of the conductive network 150 may effectively absorb the external electromagnetic waves using the conductive bar 171 having the second height h2. In an exemplary embodiment, the effective area S may be ensured on the conductive network 150 using a smaller number of conductive bars 171 because the effective area S is relatively greater than that of the one shown in FIG. 3.

Referring to FIG. 5, the conductive bars 171 having third heights h3 are arranged with constant intervals therebetween to ensure the effective area S. A third height h3 of a conductive bar 171 is lower than the first height h1 of the conductive bar 171 of FIG. 3 on the same conductive network 150, and thus, the effective area S ensured by each of the conductive bars 171 is smaller than that of the one shown in FIG. 3. Since each of the conductive bars 171 has its own effective area S, the whole effective areas may be ensured on the entire conductive network 150. In an exemplary embodiment, the number of conductive bars 171 may be increased to be more than the number of conductive bars 171 of FIG. 3 because the effective area S is relatively smaller than that of the one shown in FIG. 3.

Figure 6:
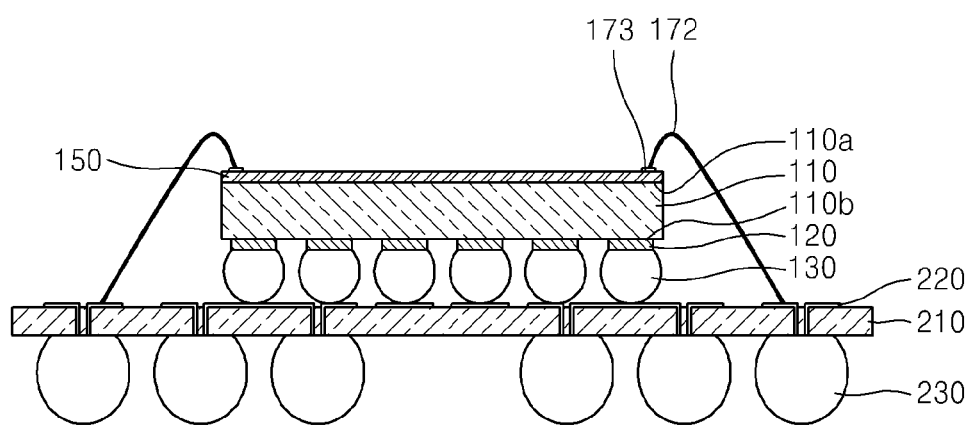
FIG. 6 is a cross-sectional view of a semiconductor package according to an exemplary embodiment of the present invention.

FIG. 6 is a cross-sectional view of a semiconductor package according to an exemplary embodiment of the present invention. The semiconductor package includes at least one conductive wire 172, instead of the conductive plug 161 of the semiconductor package shown in FIG. 1.

Referring to FIG. 6, the semiconductor package may include the conductive wire 172 that electrically connects the conductive network 150 to the main substrate 210. According to an exemplary embodiment, the conductive wire 172 is formed instead of forming the conductive plug 161 of the semiconductor package of FIG. 1. For example, the conductive wire 172 electrically connects a third conductive pad 173 formed on the conductive network 150 to the second conductive pad 220 formed on the main substrate 210.

Figure 7:
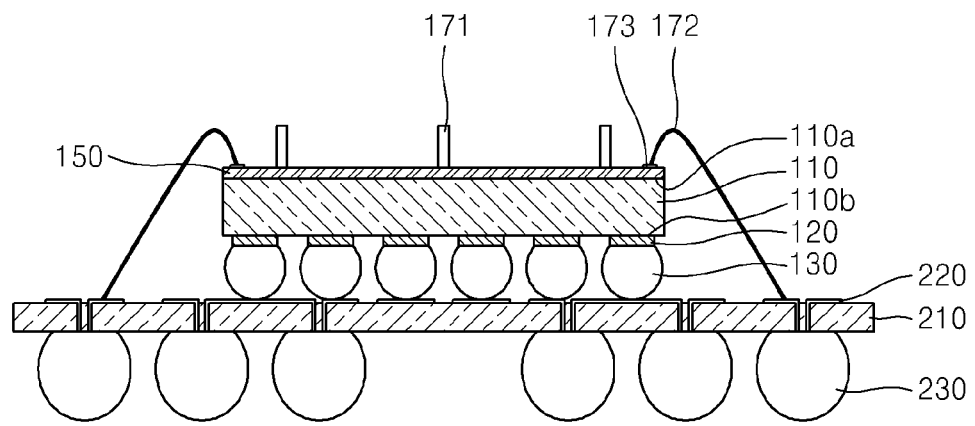
FIGS. 7 and 8 are respectively a cross-sectional view and a perspective view of a semiconductor package according to an exemplary embodiment of the present invention.
Figure 8:
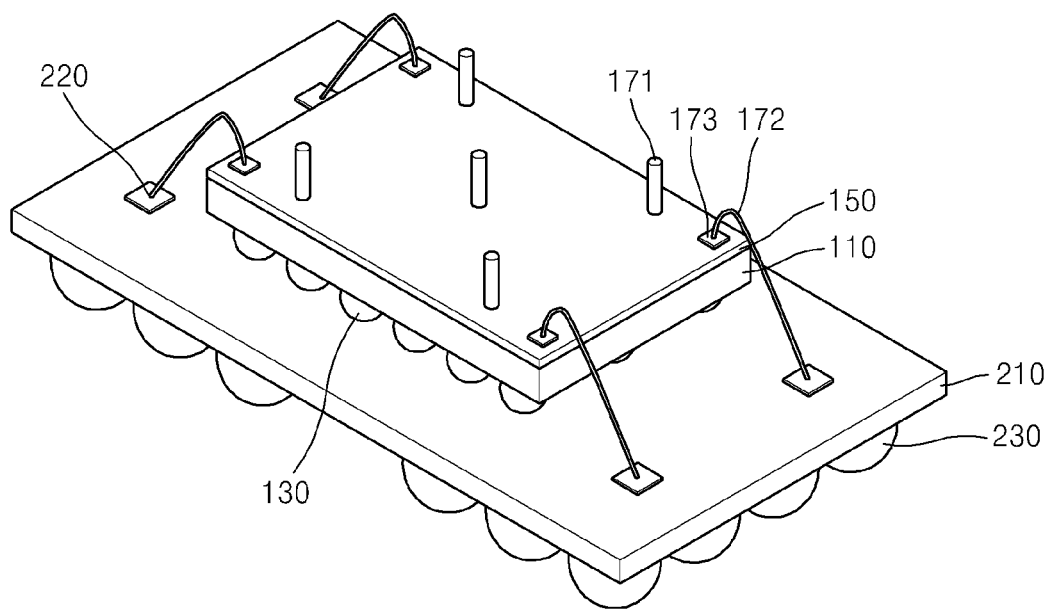

FIGS. 7 and 8 are a cross-sectional view and a perspective view showing a semiconductor package according to an exemplary embodiment of the present invention. The semiconductor package of the present embodiment includes the conductive wire 172 instead of the conductive plug 161 of the semiconductor package shown in FIG. 2.

Referring to FIGS. 7 and 8, the semiconductor package may include the conductive wire 172 that electrically connects the conductive network 150 to the main substrate 210. In an exemplary embodiment, the conductive wire 172 is formed instead of forming the conductive plug 161 shown in FIG. 2. For example, the conductive wire 172 may electrically connect the third conductive pad 173 formed on the conductive network 150 to the second conductive pad 220 formed on the main substrate 210.

Figure 9:
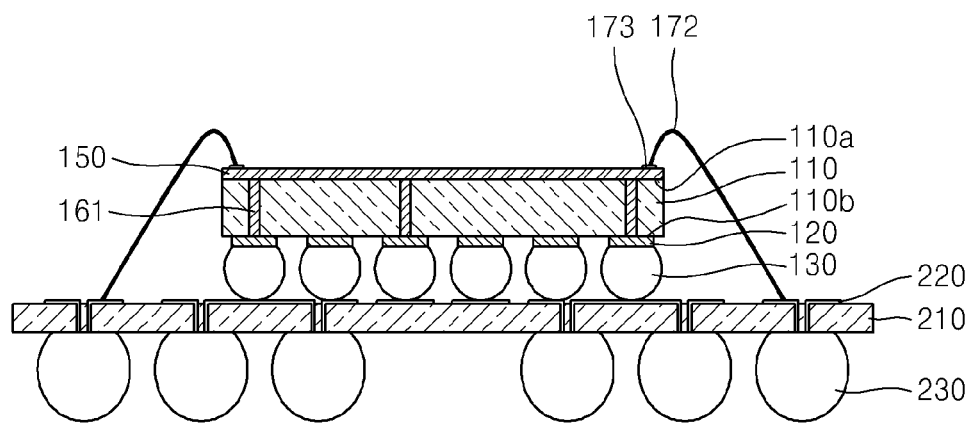
FIG. 9 is a cross-sectional view of a semiconductor package according to an exemplary embodiment of the present invention.

FIG. 9 is a cross-sectional view of a semiconductor package according to an exemplary embodiment of the present invention. The semiconductor package of the present embodiment may further include the conductive wire 172 in addition to the structures of the semiconductor package of FIG. 1.

Referring to FIG. 9, the semiconductor package may include the conductive wire 172 that electrically connects the conductive network 150 to the main substrate 210. In an exemplary embodiment, the conductive wire 172 is formed in addition to the conductive plug 161 of the semiconductor package shown in FIG. 1. For example, the conductive wire 172 may electrically connect the third conductive pad 173 formed on the conductive network 150 to the second conductive pad 220 formed on the main substrate 210.

Figure 10:
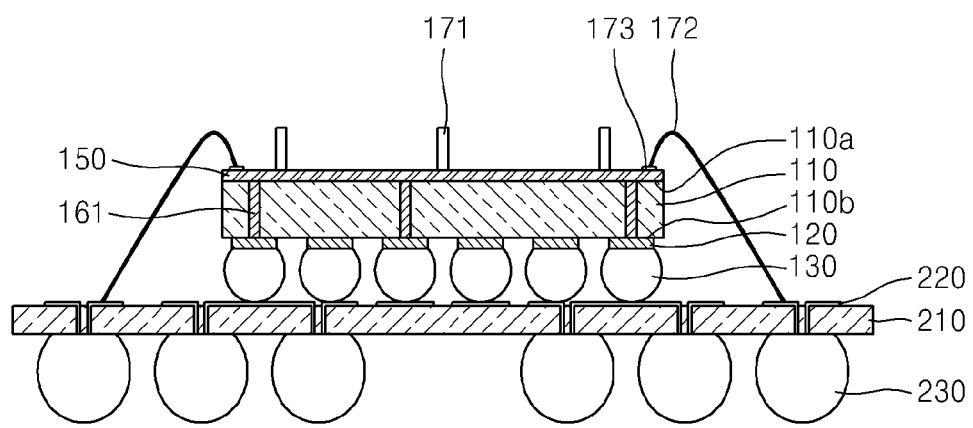
FIGS. 10 and 11 are respectively a cross-sectional view and a perspective view of a semiconductor package according to an exemplary embodiment of the present invention.
Figure 11:
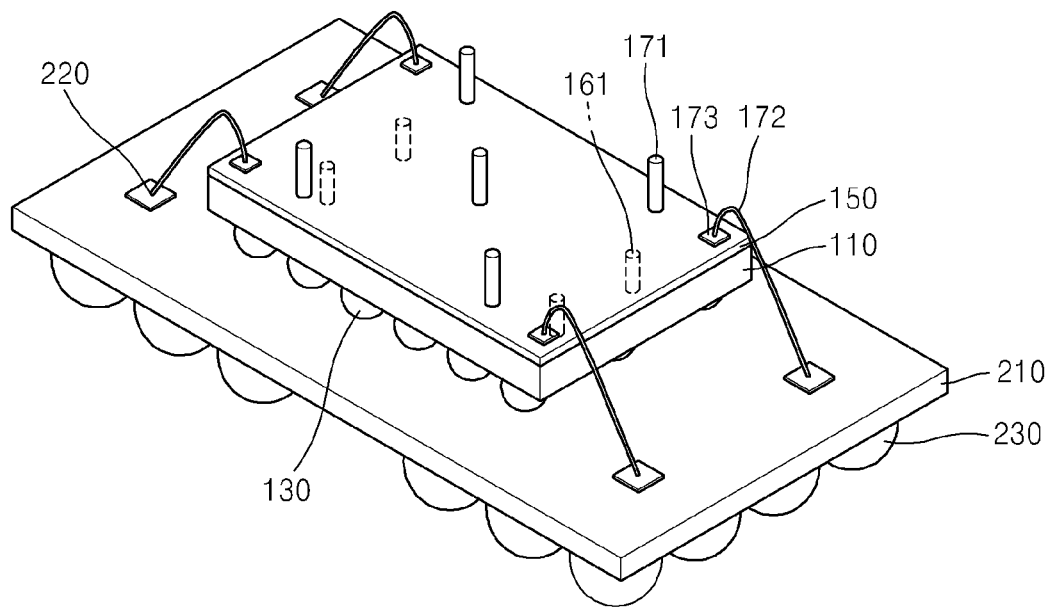

FIGS. 10 and 11 are a cross-sectional view and a perspective view showing a semiconductor package according to an exemplary embodiment of the present invention. In an exemplary embodiment, the semiconductor package further includes at least one conductive bar 171 in addition to the structures of the semiconductor package shown in FIG. 9.

Referring to FIGS. 10 and 11, the conductive bar 171 may be further attached on the conductive network 150. The conductive bar 171 may be attached to the conductive network 150 in a direction perpendicular to the conductive network 150. Diameters of the upper and lower portions of the conductive bar 171 may be equal to each other. A horizontal cross-section of the conductive bar 171 may have a curvature on at least a part, or may have a polygonal shape without having a curvature. The diameter of the conductive bar 171 may vary depending on the shape of the semiconductor package. The conductive bar 171 may be formed of a material having a high electrical conductivity, for example, at least one of gold, silver, or aluminum.

The conductive bar 171 may be attached to the conductive network 150 in various ways. For example, a wire bonding method that is generally used in the semiconductor packaging processes, or an electroplating method may be used to attach the conductive bar 171 to the conductive network 150. In an exemplary embodiment, a MEMS may be used. The fabrication process of the conductive bar 171 may be determined in consideration of the size of semiconductor package or an environment in which the conductive bar 171 is fabricated.

A wire bonding method, an electric plating method, or an MEMS method may be used to attach the conductive bar 171. For example, the conductive bar 171 may be attached to the conductive network 150 by using the wire bonding method. In an exemplary embodiment, a wire is attached to the conductive network 150, and after that, the wire is grown in a direction perpendicular to the conductive network 150. The growth of the wire is stopped at an appropriate height, thereby forming the conductive bar 171. Accordingly, the conductive bar 171 may be fabricated easily using a known wire bonding method.

The conductive bar 171 increases the efficiency of absorbing electromagnetic waves induced from the outside. As a height h of the conductive bar 171 increases, an effective area S which absorbs the electromagnetic waves and transmits the electromagnetic waves to the conductive network 150 increases. In an exemplary embodiment, a maximum angle (α) between the effective area S and the conductive bar 171 is 45°. That is, a radius of the effective area S may be same as the height h of the conductive bar 171. Therefore, the effective area S may vary depending on the height h of the conductive bar 171.

In an exemplary embodiment, the conductive network 150 and the conductive bar 171 may have different shapes and arrangements from those of FIGS. 2 and 3. That is, the shapes and arrangements of the conductive network 150 and the conductive bar 171 may vary depending on the shape and usage of the semiconductor package.

Figure 12:
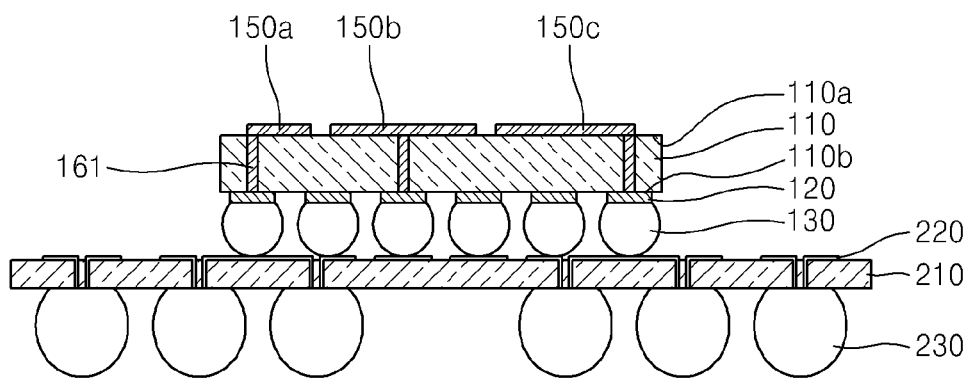
FIG. 12 is a cross-sectional view of a semiconductor package according to an exemplary embodiment of the present invention.

FIG. 12 is a cross-sectional view of a semiconductor package according to an exemplary embodiment of the present invention. The semiconductor package of the present embodiment includes a conductive network that is modified from the conductive network 150 of FIG. 1.

Referring to FIG. 12, the conductive network 150 may include separated conductive networks 150a, 150b, and 150c that cover the back side 110a of the semiconductor chip 110.

The separated conductive networks 150a, 150b, and 150c may be formed of redistributed metal wires formed on the back side 110a of the semiconductor chip 110. Each of the separated conductive networks 150a, 150b, and 150c may include a conductive plane or conductive lines covering at least a part of the back side 110a of the semiconductor chip 110.

For example, a conductive network 150a of the conductive network 150 may form an antenna in the semiconductor package, and the other conductive networks 150b and 150c of the conductive network 150 may form a static electricity discharging portion for discharging static electricity out of the semiconductor package. In an exemplary embodiment, some of the separated conductive networks 150a, 150b, and 150c that are separated according to the shape and usage of the semiconductor package may be connected to each other.

The conductive plugs 161 that are connected to the separated conductive networks 150a, 150b, and 150c and penetrate through the semiconductor chip 110 may be formed. For example, when the semiconductor chip 110 is formed of silicon substrate, the conductive plugs 161 may be formed by a TSV process. A conductive plug 161 may be connected to the first conductive pad 120 that is formed on the front side 110b of the semiconductor chip 110.

Figure 13:
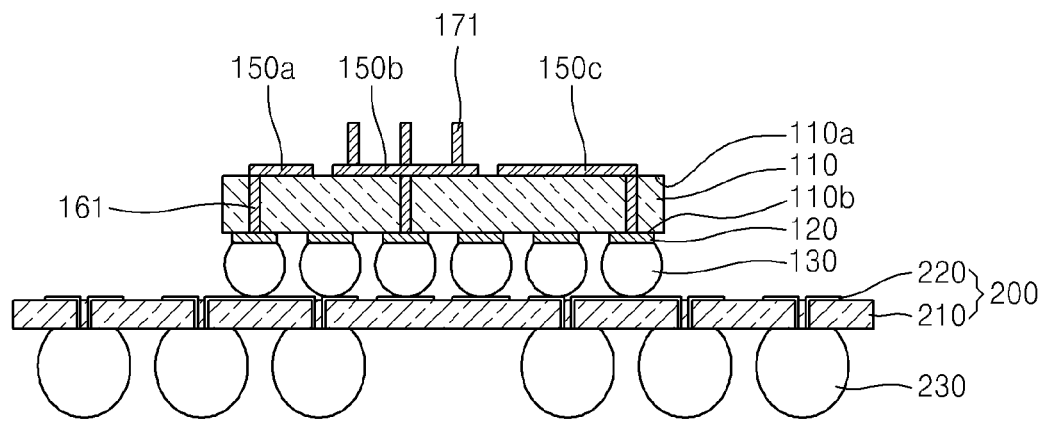
FIGS. 13 and 14 are respectively a cross-sectional view and a perspective view of a semiconductor package according to an exemplary embodiment of the present invention.
Figure 14:
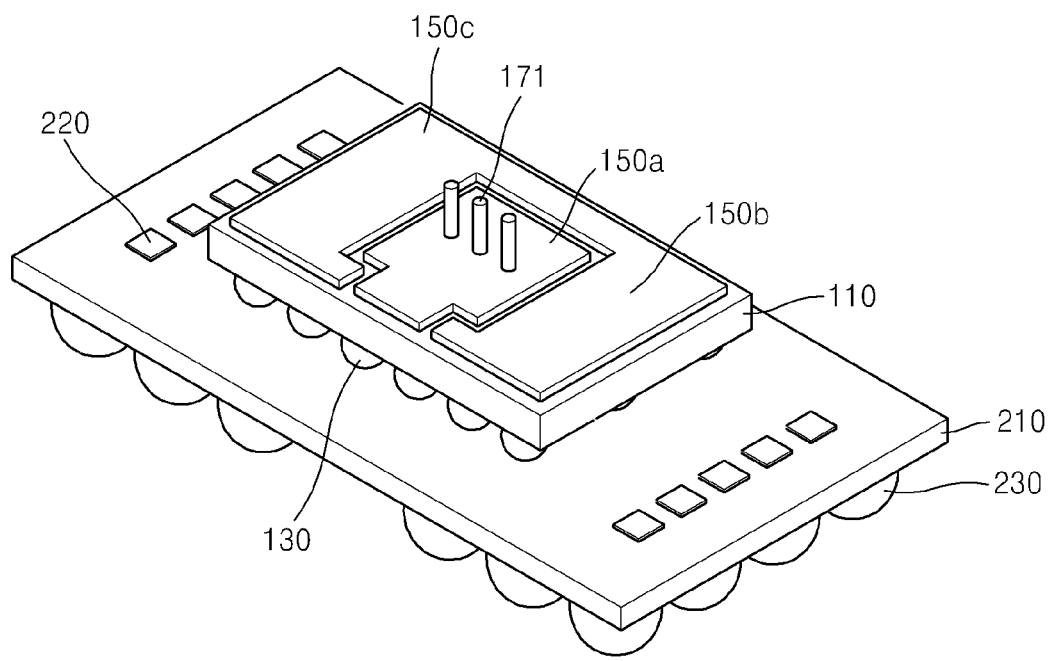

FIGS. 13 and 14 are a cross-sectional view and a perspective view of a semiconductor package according to an exemplary embodiment of the present invention. The semiconductor package of the present embodiment further includes at least one conductive bar 171 in addition to the structures of the semiconductor package shown in FIG. 12.

Referring to FIGS. 13 and 14, the semiconductor package may include the conductive bar 171 formed on the conductive network 150a. The conductive bar 171 may be attached to the conductive networks 150a, 150b, and 150c in a direction perpendicular to the conductive networks 150a, 150b, and 150c. A horizontal cross-section of the conductive bar 171 may have a curvature on at least a part, or may have a polygonal shape without having a curvature. The diameter of the conductive bar 171 may vary depending on the shape of the semiconductor package. The conductive bar 171 may be formed of a material having a high electrical conductivity, for example, at least one of gold, silver, or aluminum.

The conductive bar 171 may be attached to the conductive networks 150a, 150b, and 150c in various ways. For example, a wire bonding method that is generally used in the semiconductor packaging processes, or an electroplating method may be used to attach the conductive bar 171 to the conductive networks 150a, 150b, and 150c. In an exemplary embodiment, a MEMS may be used. The fabrication process of the conductive bar 171 may be determined in consideration of the size of semiconductor package or an environment in which the conductive bar 171 is fabricated.

A wire bonding method, an electric plating method, or an MEMS method may be used to attach the conductive bar 171 according to an exemplary embodiment of the present invention. For example, the conductive bar 171 may be attached to the conductive networks 150a, 150b, and 150c by using the wire bonding method. In an exemplary embodiment, a wire is attached to the conductive networks 150a, 150b, and 150c, and after that, the wire is grown in the direction perpendicular to the conductive networks 150a, 150b, and 150c. The growth of the wire is stopped at an appropriate height, thereby forming the conductive bar 171. Accordingly, the conductive bar 171 may be fabricated easily using a known wire bonding method, and fabrication costs may be reduced.

The conductive bar 171 increases the efficiency of absorbing electromagnetic waves induced from the outside. As a height of the conductive bar 171 increases, an effective area S which absorbs the electromagnetic waves and transmits the electromagnetic waves to the conductive networks 150a, 150b, and 150c increases. In an exemplary embodiment, a maximum angle (α) between the effective area S and the conductive bar 171 is 45°. That is, a radius of the effective area S may be same as the height h of the conductive bar 171. Therefore, the effective area S may vary depending on the height h of the conductive bar 171.

In an exemplary embodiment, the conductive networks 150a, 150b, and 150c and the conductive bar 171 may have different shapes and arrangements from those of FIGS. 13 and 14. That is, the shapes and arrangements of the conductive networks 150a, 150b, and 150c and the conductive bar 171 may vary depending on the shape and usage of the semiconductor package.

The semiconductor package shown in FIGS. 13 and 14 may further include conductive wires that electrically connect the conductive networks 150a, 150b, and 150c to the main substrate 210.

The semiconductor chip 110 can be a single chip of a single-layered structure. In an exemplary embodiment, the semiconductor chip 110 may be a multi-chip in which a plurality of semiconductor chips are sequentially stacked. In an exemplary embodiment, a conductive network is formed on a back side of the uppermost semiconductor chip. In an exemplary embodiment, conductive plugs may penetrate each of the plurality of semiconductor chips and may be electrically connected to each other. In an exemplary embodiment, the conductive wires may electrically connect the conductive network to the main substrate.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. A semiconductor package comprising:
   a main substrate;
   a semiconductor chip having a first side and a second side opposite to the first side, the first side of the semiconductor chip disposed on the main substrate and electrically connected to the main substrate;

a conductive network formed on the second side of the semiconductor chip;

at least one conductive bar extending from the conductive network without penetrating the semiconductor chip; and at least one conductive wire electrically connecting the conductive network to the main substrate, wherein the first side faces the main substrate and the second side faces away from the main substrate.

2. The semiconductor package of claim 1, wherein the semiconductor package is a flip-chip package.

3. The semiconductor package of claim 1, further comprising:

at least one conductive plug disposed in the semiconductor chip and electrically connecting the conductive network to the main substrate.

4. The semiconductor package of claim 1, further comprising:

a connection member electrically connecting the main substrate to the semiconductor chip.

5. The semiconductor package of claim 1, wherein the conductive network includes a conductive plane or conductive lines that cover at least a part of the second side of the semiconductor chip.

6. The semiconductor package of claim 1, wherein the conductive network is formed of redistributed metal wires.

7. The semiconductor package of claim 1, wherein the at least one conductive bar is perpendicular to the conductive network.

8. The semiconductor package of claim 1, further comprising:

a grounding portion discharging the static electricity absorbed from the conductive network.

9. A semiconductor package comprising:

a main substrate;

a semiconductor chip having a first side and a second side opposite to the first Side, the first side of the semiconductor chip disposed on the main substrate and electrically connected to the main substrate;

a conductive network formed on the second side of the semiconductor chip;

at least one conductive bar extending from the conductive network without penetrating the semiconductor chip;

at least one conductive plug which penetrates the semiconductor chip and electrically connects the conductive network to the main substrate; and at least one conductive wire electrically connecting the conductive network to the main substrate, wherein the first side faces the main substrate and the second side faces away from the main substrate.

10. A semiconductor package comprising:

a main substrate;

a semiconductor chip having a first side and a second side opposite to the first side, the first side of the semiconductor chip disposed on the main substrate and electrically connected to the main substrate;

a conductive network formed on the second side of the semiconductor chip;

at least one conductive bar extending from the conductive network without penetrating the semiconductor chip; and at least one conductive wire electrically connecting the conductive network to the main substrate, wherein the conductive network includes a first part and a second part separated from the first part.

11. The semiconductor package of claim 10, further comprising a conductive member disposed between the first side of the semiconductor chip and the main substrate.

12. The semiconductor package of claim 10, further comprising at least one conductive plug disposed in the semiconductor chip and electrically connecting the conductive network to the main substrate.

13. The semiconductor package of claim 10, further comprising:

a grounding portion discharging the static electricity absorbed from the conductive network.

* * * * *